(12) United States Patent
Kimura

(10) Patent No.: US 6,393,209 B2
(45) Date of Patent: May 21, 2002

(54) LAMP UNIT FOR A PHOTOIRRADIATING HEATING DEVICE

(75) Inventor: Masatoshi Kimura, Kakogawa (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/774,078

(22) Filed: Jan. 31, 2001

(30) Foreign Application Priority Data

Jan. 31, 2000 (JP) ........................................ 2000-022045

(51) Int. Cl.$^7$ ................................................ H01K 1/00
(52) U.S. Cl. ...................... 392/407; 118/724; 313/110; 219/530
(58) Field of Search .................... 392/407; 313/110, 313/113; 362/362, 368–370; 219/530; 118/724

(56) References Cited

U.S. PATENT DOCUMENTS

| | | | |
|---|---|---|---|
| 1,555,902 A | * 10/1925 | Brady | 362/362 |
| 1,573,394 A | * 2/1926 | Gough | 362/362 |
| 3,891,841 A | * 6/1975 | Codrino | 362/32 |
| 4,100,592 A | * 7/1978 | Henkel et al. | 362/191 |
| 4,282,566 A | * 8/1981 | Newman | 362/369 |
| 5,155,336 A | 10/1992 | Gronet et al. | |
| 5,744,901 A | * 4/1998 | Friederichs et al. | 313/113 |
| 5,848,909 A | * 12/1998 | Tsai | 439/206 |
| 6,210,029 B1 | * 4/2001 | Noll et al. | 362/549 |

FOREIGN PATENT DOCUMENTS

| | | | |
|---|---|---|---|
| CA | 2193286 | * | 6/1997 |
| JP | 54-33384 | * | 3/1979 |

* cited by examiner

*Primary Examiner*—John A. Jeffery
(74) *Attorney, Agent, or Firm*—Nixon Peabody LLP; David S. Safran

(57) ABSTRACT

A lamp unit that is useful in a photoirradiating-type heating device that does not contaminate the processing chamber of a photoirradiating-type heating device, that permits the lamp to be reliably cooled, that permits the lamp to be reliably turned on, that inhibits the decline in the reflectance on the inner surface of an optical guide, and that permits attenuation of irradiation intensity to be inhibited. The lamp unit has a metal sleeve with an aperture at one end and a single ended lamp mounted so that sealed part of the lamp would be situated on the inside of the sleeve on the aperture side of sleeve, a coupling member having a contact support unit that makes contact with the outer surface of a sealed part of the lamp by elastic force as well as a contact fastening unit that makes contact with the inner surface of the sleeve after the contact support unit and that also fastens a single ended lamp to the sleeve.

7 Claims, 10 Drawing Sheets

LAMP UNIT FOR A PHOTOIRRADIATING HEATING DEVICE

BACKGROUND OF THE INVENTION

1. Field of the Invention

The present invention is directed to a lamp unit utilized in a photoirradiating-type heating device that carries out heating treatment utilizing light for growing, diffusing and annealing semiconductor wafers. More particularly, the invention is directed to lamp unit that is useful in a photoirradiating-type heating device that does not contaminate the processing chamber of the device, that permits the lamp to be reliably cooled, that permits the lamp to be reliably turned on, that inhibits the decline in the reflectance on the inner surface of an optical guide, and that permits attenuation of irradiation intensity to be inhibited. The lamp unit has a metal sleeve with an aperture at one end and a single ended lamp mounted so that sealed part of the lamp would be situated on the inside of the sleeve on the aperture side of sleeve, a coupling member having contact support unit that makes contact with the outer surface of a sealed part of the lamp by elastic force as well as a contact fastening unit that makes contact with the inner surface of the sleeve after the contact support unit and that also fastens a single ended lamp to the sleeve.

2. Description of the Related Art

Photoirradiating type heating devices have been used over a broad range of procedures in semiconductor production including growth, diffusion and annealing. Semiconductor wafers are subjected to uniform heating processing at high temperatures to rapidly heat wafers through photoirradiation in all processing, and temperature elevation to levels exceeding 1000 degrees Celsius can take anywhere from a dozen seconds to several dozen seconds. After holding at a fixed temperature, the wafer is rapidly cooled by halting photoirradiation.

FIG. 1 shows a conventional photoirradiating-type heating device as is known from U.S. Pat. No. 5,155,336. In the figure, a wafer 3 is shown supported on a wafer suppport stage 2 for heat processing within a processing chamber 1 partitioned by a quartz window 8. The quartz window 8 is used when the ambient atmospheres of the wafer 3 and the lamp 4 differ. The lamp 4 is a single ended lamp in which a sealed part 41 is mounted only at one edge of the lamp 4. As shown in FIG. 1, a plurality of lamps are disposed over the wafer 3. The sealed part 41 of each lamp 4 is disposed within cylindrical metal sleeve 5. The lamp 4 is fastened to the sleeve 5 by an adhesive and the sleeve 5 is mated within a cylindrical optical guide 7 composed of a metal-plated stainless steel that is fastened to a wall member 6. The space formed by the wall 6 and the optical guide 7 forms a cooling chamber 9 in which a cooling liquid is flowed.

As shown in FIG. 2, a front optical guide 71 is mounted in front of the aperture of the optical guide 7 to efficiently reflect light from the lamp 4 off of wafer 3, but the optical guide 7 may be extended to complete a structure that doubles as the front optical guide 71. When power is applied to the lamp 4, the filament within the lamp 4 fires and the light that is irradiated directly upon the wafer 3 is also reflected off the inside reflecting surface of front of the optical guide 71, thereby heating the wafer 3. A cooling liquid is flowed within the cooling chamber 9 so that the temperature of the sealed part 41 of the lamp 4, the optical guide 7 and the sleeve 5 is not raised excessively by the radiant energy from the lamp 4. The sealed part 41 of the lamp 4 is positioned within at one end of the cylindrical metal sleeve 5. The sealed part 41 is fastened to the sleeve 5 by an inorganic, inelastic adhesive S. In this way, a lamp unit is constructed in which lamp 4 and sleeve 5 are integrated by adhesive S. The sleeve 5 is constructed so that the sides contact cylindrical optical guide 7. Adhesive S fastens lamp 4 and also vents heat from sealed part 41 accompanying lighting of lamp 4 as well as heat from the luminous tube after sealed part 41 to sleeve 5 via adhesive S. Heat transmitted to sleeve 5 is conveyed to optical guide 7 which is cooled by the cooling liquid circulating about the exterior of optical guide 7 to ultimately cool lamp 4.

The conventional device, however, has several disadvantages. For example, adhesive S packed in sleeve 5 is exposed to processing chamber 1 at the bottom of optical guide 7. When stress is repeatedly applied to inelastic adhesive S through turning lamp 4 on/off, part of adhesive S peels off and falls into processing chamber 1 to contaminate it. In addition, when packing adhesive S within slender sleeve 5, it is difficult to completely pack adhesive S within sleeve 5, and thereby leaving gaps K where adhesive S was not packed within sleeve 5. In this case, efficient venting of heat from sealed part 41 via adhesive S is impossible due to such gaps K. Adequate cooling cannot be carried out and the cooling effect is attenuated. Furthermore, if adhesive S packed within slender sleeve 5 is inadequately dried because of the difficulty of complete drying, lead wires 10 are shorted by moisture contained within adhesive S when lamp 4 is turned on and lamp 4 becomes inoperative.

In addition, adhesive S is heated when lamp 4 is turned on and the moisture contained within adhesive S is released. It then contaminates the inner surface N (the region denoted by the broken lines for convenience) of front optical guide 71 on the aperture side of optical guide 7, thereby lowering the reflectance on the inner surface of front optical guide 71, and precluding efficient wafer heating. When lamp 4 is lit, the temperature of adhesive S rises, thereby releasing moisture contained in adhesive S. This causes devitrification of the luminous tube of lamp 4 which lowers the irradiation intensity.

SUMMARY OF THE INVENTION

Accordingly, an object of the invention is to overcome the disadvantages of the prior art in devising a lamp unit that is useful in a photoirradiating type heating device that does not contaminate the processing chamber of a photoirradiating type heating device, that permits the lamp to be reliably cooled, that permits the lamp to be reliably turned on, that inhibits the decline in the reflectance on the inner surface of an optical guide, and that permits attenuation of irradiation intensity to be inhibited.

The lamp unit includes a cylindrical metal sleeve having an aperture at one end and made of SUS steel and a single ended lamp mounted so that a sealed part of the lamp can be situated on the inside of the sleeve. The lamp is fastened to the sleeve by a coupling member attached to the sleeve and which supports the sealed part of the lamp. The coupling member is composed of a single piece of aluminum that is bent so as to form a contact support unit and a contact fastening unit. Due to the bending, elastic force is generated in the contact support units and the contact fastening units.

The contact support units contact the outer surface of the sealed part of the lamp to enable the coupling member to pinch and support the sealed part by elastic force. Accordingly, the contact fastening units that contacts the inner surface of the sleeve is formed after the contact support unit. The contact fastening unit makes contact with the inner surface of the sleeve utilizing the force that opens outwardly through the elastic stress of the coupling member itself. The contact fastening unit fits against a projection to thereby fasten the lamp to the sleeve.

In this way, the various problems associated with using an adhesive are obviated since the lamp is mechanically fastened without using an adhesive. For example, the interior of the processing chamber is not contaminated by peeling of adhesive itself and the shorting of lead lines that supply power to lamp do not occur due to the effects of moisture contained in the adhesive. Moreover, the decline in the reflectance due to the contamination by moisture on the inner surface of the optical guide or front optical guide and devitrification of the luminous tube do not occur. And, the irradiation intensity is not attenuated since adhesive is not used.

Furthermore, since the sleeve is mated to the optical guide on its outer circumferential surface, heat from the lamp is transmitted to the coupling member via the sealed part. The heat transmitted to coupling member is subsequently transmitted to the sleeve. The heat transmitted to sleeve is subsequently transmitted to the optical guide. The heat transmitted to the optical guide is subsequently transferred to the cooling liquid circulating on the outer surface. Consequently, a series of heat-conduction passages are formed that reliably cool the lamp.

The coupling member need not be composed exclusively from metal, and pre-molded plastic having a high heat resistance or a ceramic material coated on the surface with a heat-transmitting material may be used. In short, any unit that reliably fastens the lamp to the sleeve and which transmits heat from the lamp to the sleeve may be used. A heat-transfer sleeve that does not impair the support between the sealed part and the contact support unit of the coupling member and which raises the heat-transfer characteristics may be interposed to improve the contact between these units.

The section of the coupling member opposes a luminous unit of the lamp and forms a reflection surface. The reflectance on the surface of reflection surface can be raised by applying a metal coating. As a result, the light radiated from the lamp and reflected from the inner surface of the front optical guide and then returned toward the lamp can be efficiently reflected in the direction of the aperture of the front optical guide to permit efficient wafer heating.

In a second embodiment, the lamp unit includes a coupling member comprising a contact fastening unit composed of a block of aluminum and a flat contact support unit composed of copper. When the contact support unit contacts the sealed part, part of the contact support unit forms a projection which mates with a depression of the sealed part to reliably support the lamp. On the other hand, the external shape of the contact fastening unit is cylindrical, having an outer diameter which is roughly equal to the inner diameter of the sleeve. The contact fastening unit is pushed and press-fit to the forward aperture of the sleeve with the outer circumference of the contact fastening unit mated and fastened to the inner surface of the sleeve.

The contact support unit comprises a set of metal plates, one end of which is bent in advance to provide elasticity to the projection. An insertion aperture of the lamp sealed part contact fastening unit is fitted in this state. When one end of the contact support unit penetrates the contact fastening unit, the other edge that penetrates and jumps out is bent. The sealed part of the lamp is press-fit in the gap formed with the opposing contact support unit, and both sides of the sealed part are pinched and supported by the contact fastening unit. The surface of the contact support unit that faces the luminous unit of the lamp then forms the reflection surface.

In a third embodiment, the lamp unit includes a coupling member having a contact support unit and the contact fastening unit as separate units. The contact support unit comprises a set of metal plates that are bent in prescribed shape, to provide elasticity. The plates contact both sides of the sealed part to pinch and support it. While the lamp is supported by the contact support unit, it is fitted so as to contact the inner surface of the contact fastening unit. Accordingly, contact support unit is firmly fastened to the contact fastening unit by the outward expansive elastic force of the contact support unit and the sealed part is pinched and supported by the contact support unit.

DETAILED DESCRIPTION OF THE PREFERRED EMBODIMENTS

Figure 1:
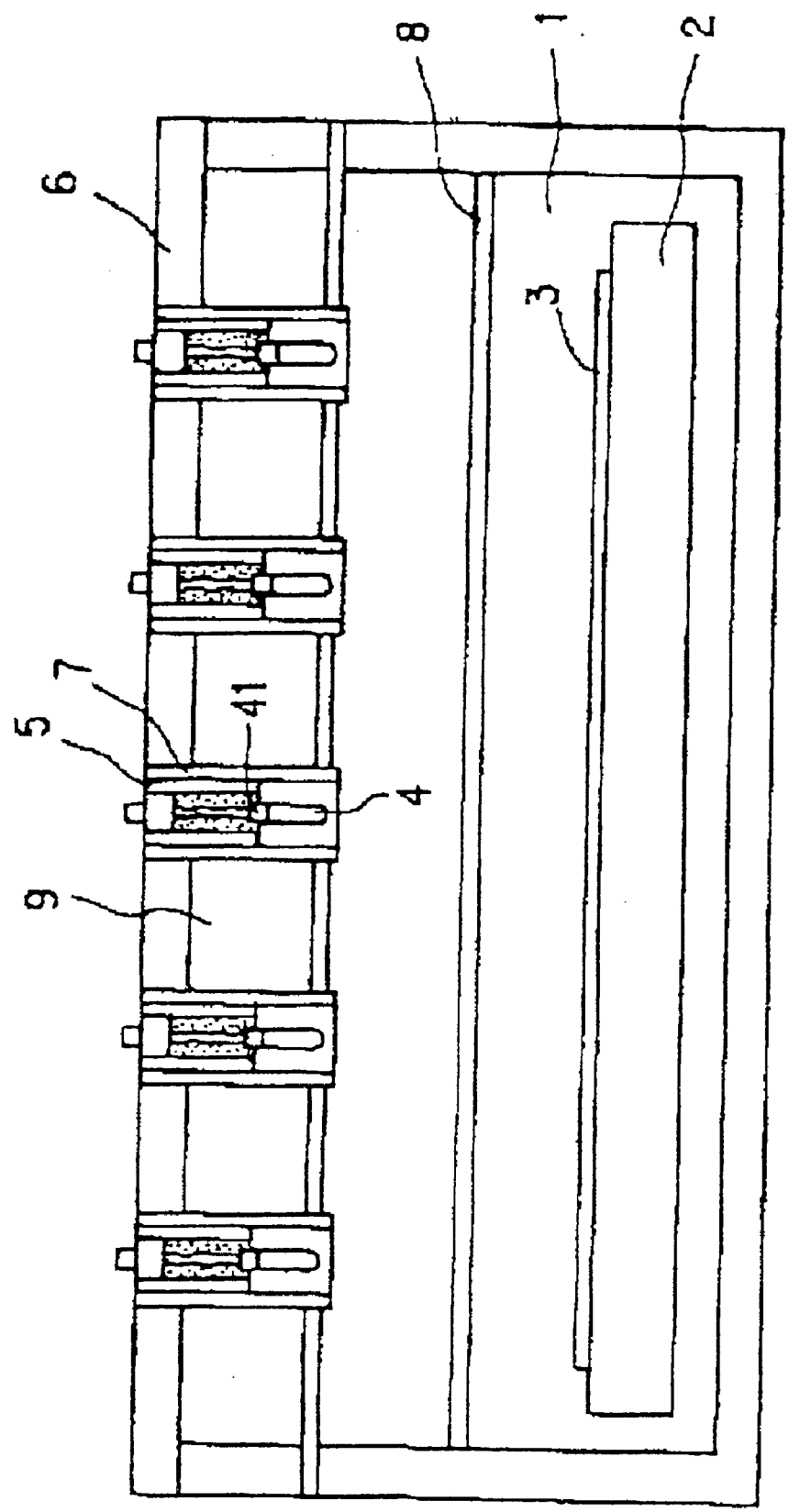
FIG. 1 is a side view of a photoirradiating-type heating device of a conventional lamp unit.
Figure 2:
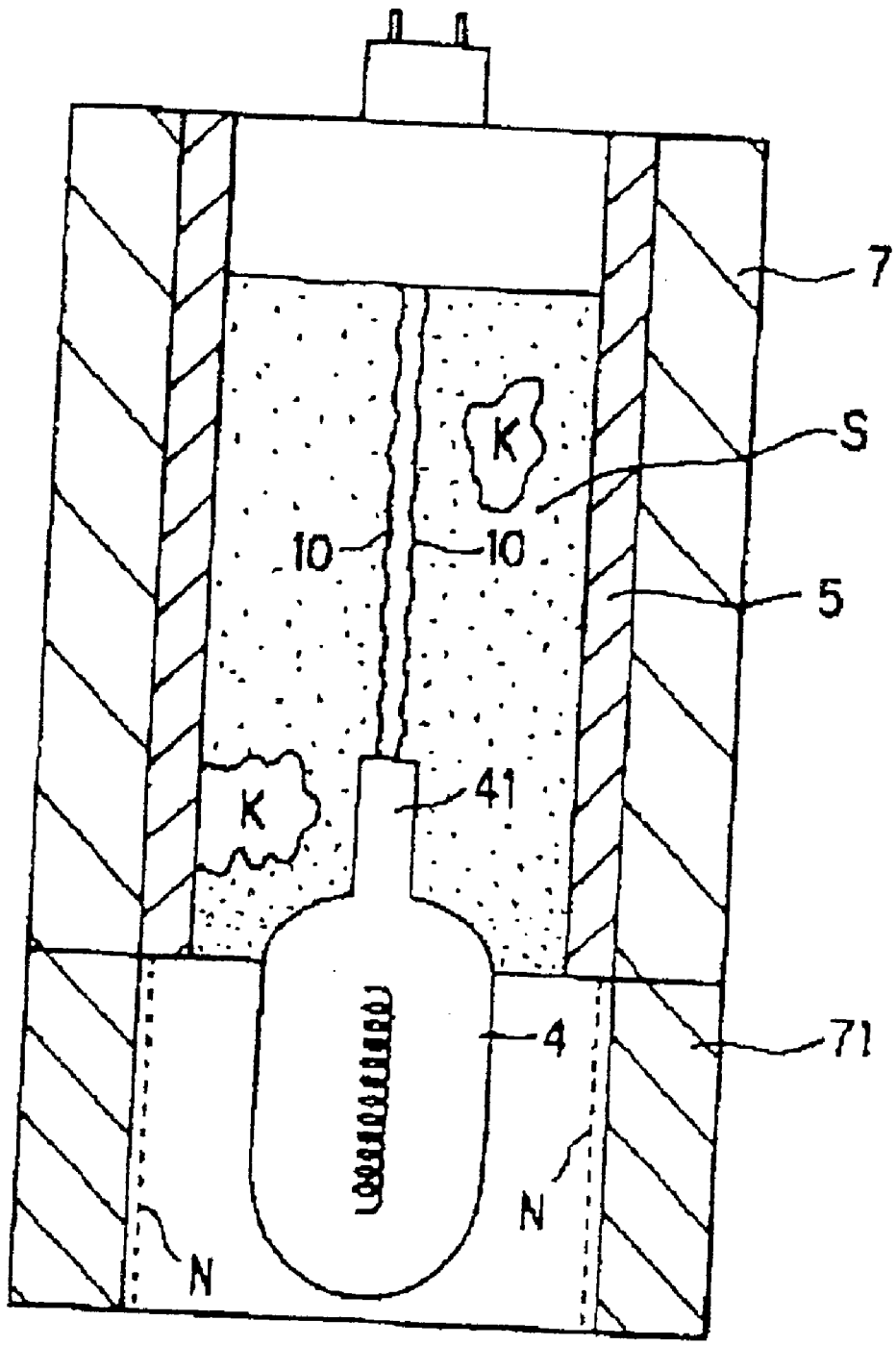
FIG. 2 is a side view of a conventional lamp unit.
Figure 3:
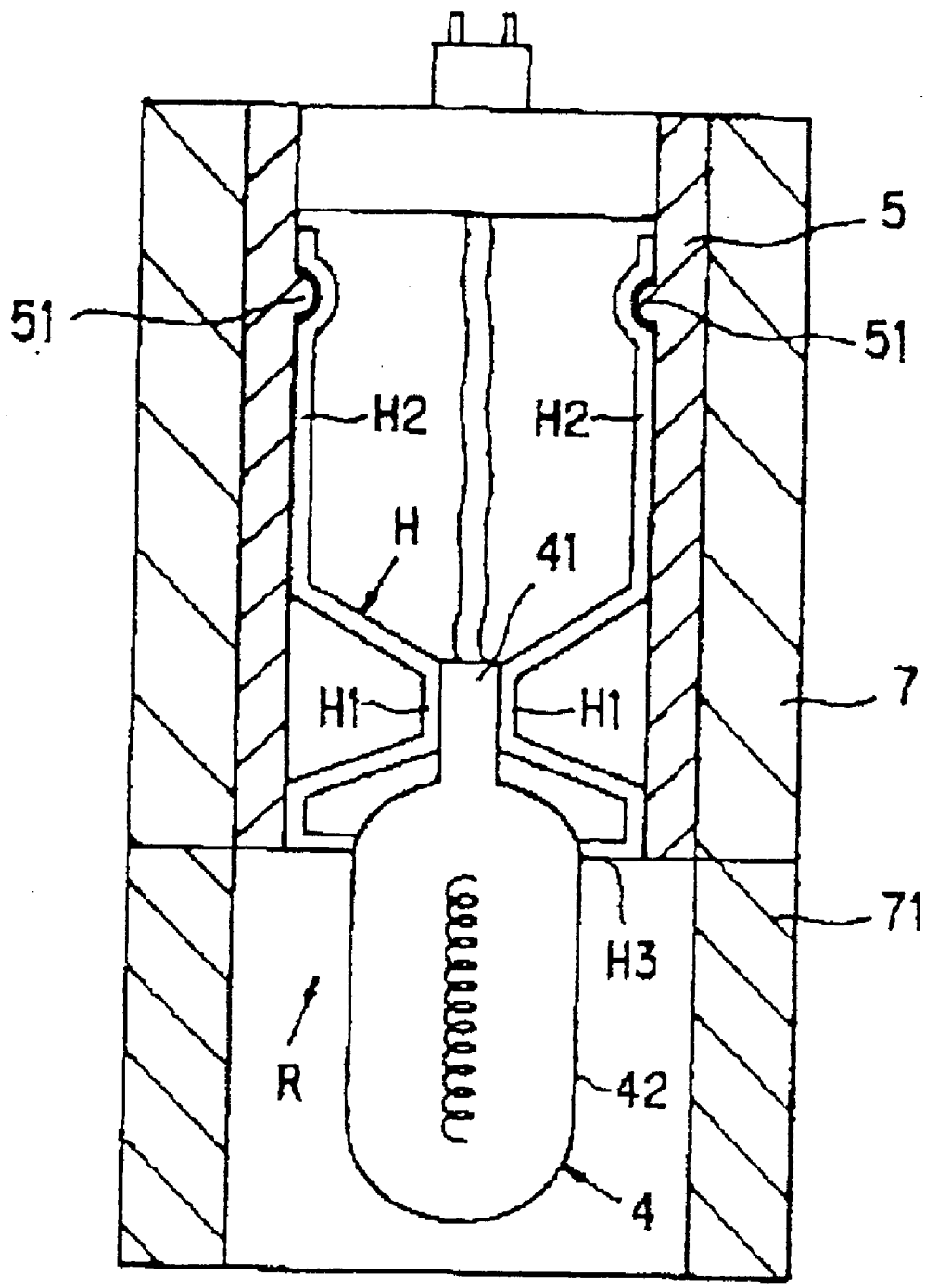
FIG. 3 is a side view of the lamp unit in accordance to the present invention.
Figure 4:
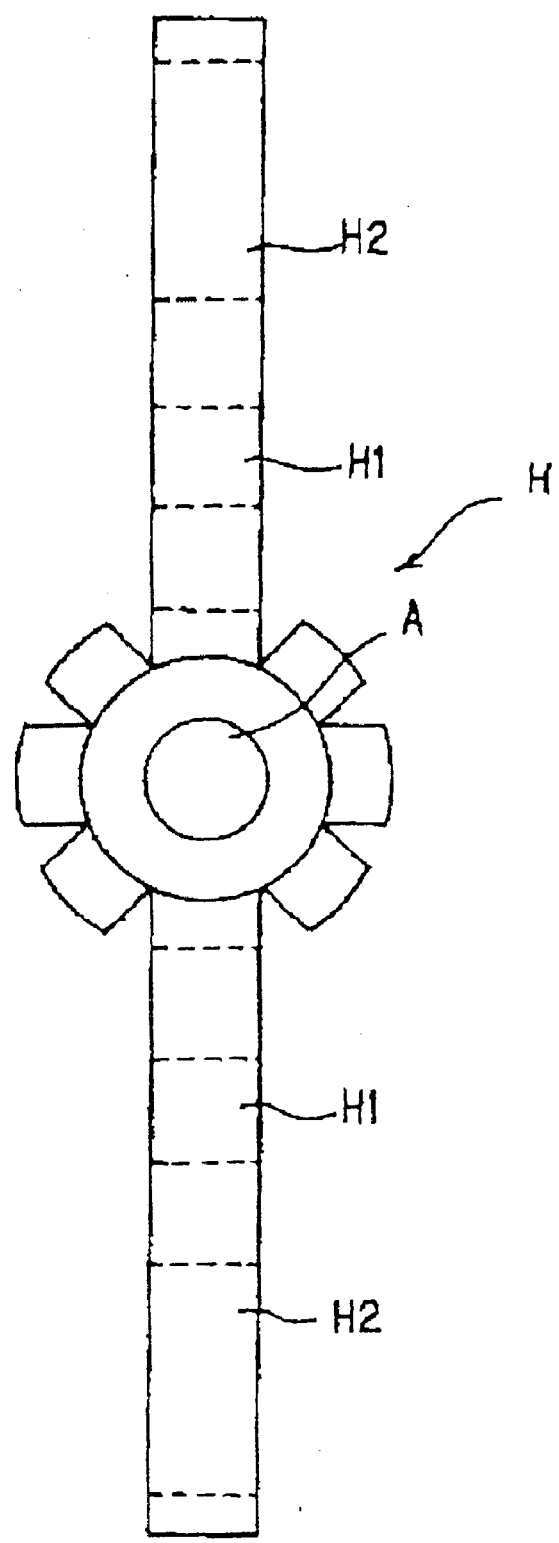
FIG. 4 shows the coupling member of the lamp unit in FIG. 3.

In FIG. 3, the lamp unit R comprises a cylindrical metal sleeve 5 made of SUS steel and a single ended lamp 4 mounted so that sealed part 41 of the lamp would be situated on the inside of sleeve 5 having an aperture at one end. Lamp 4 is fastened to sleeve 5 by coupling member H that is connected to sleeve 5 and that supports sealed part 41 of lamp 4. Coupling member H is made of a single piece of aluminum that is bent at the sections denoted by dotted lines so as to form contact support unit H1 and contact fastening unit H2, as shown in FIG. 4. Elastic force is generated in contact support unit H1 and contact fastening unit H2 by such bending. Sealed part 41 of lamp 4 fits in section A in the diagram.

Contact support unit H1 contacts the outer surface of sealed part 41 of lamp 4 on both sides to enable coupling member H to pinch and support sealed part 41 by elastic force. Then, contact fastening unit H2 that contacts the inner surface of sleeve 5 is formed after contact support unit H1. Contact fastening unit H2 makes contact with the inner surface of sleeve 5 utilizing the force that opens outwardly through the elastic stress of coupling member H itself. It fits against projection 51 to fasten lamp 4 to sleeve 5. In this way, the various issues associated with adhesive which had posed problems in the past are solved since lamp 4 is fastened without using adhesive.

Concretely, the interior of the processing chamber is not contaminated by peeling of adhesive itself. The shorting of lead lines that supply power to lamp 4 due to the effects of moisture contained in adhesive does not take place. The decline in the reflectance due to contamination by moisture on the inner surface of optical guide 7 or front optical guide 71 does not take place. Devitrification of the luminous tube does not take place and the irradiation intensity is not attenuated since adhesive is not used. Furthermore, sealed part 41 of lamp 4 is connected to sleeve 5 by coupling member H, as mentioned above. Since sleeve 5 is mated to optical guide 7 on its outer circumferential surface, heat from lamp 4 is transferred or transmitted to coupling member H via sealed part 41. The heat transmitted to coupling member H is then transmitted to sleeve 5. The heat transmitted to sleeve 5 is then transmitted to optical guide 7. The heat transmitted to optical guide 7 is then transferred to the cooling liquid circulating on the outer surface. Consequently, a series of heat-conduction passages are formed that reliably cool lamp 4.

Coupling member H need not be composed exclusively from metal. Pre-molded plastic having high heat resistance or ceramic material coated on the surface with heat-transmitting material may be used. In short, any unit that reliably fastens lamp 4 to sleeve 5 that transmits heat from lamp 4 to metal sleeve 5 may be used. A heat-transfer sleeve that does not impair the support between sealed part 41 and contact support unit H1 of coupling member H and which raises the heat-transfer characteristics may be interposed to improve the contact between these units.

Figure 5:
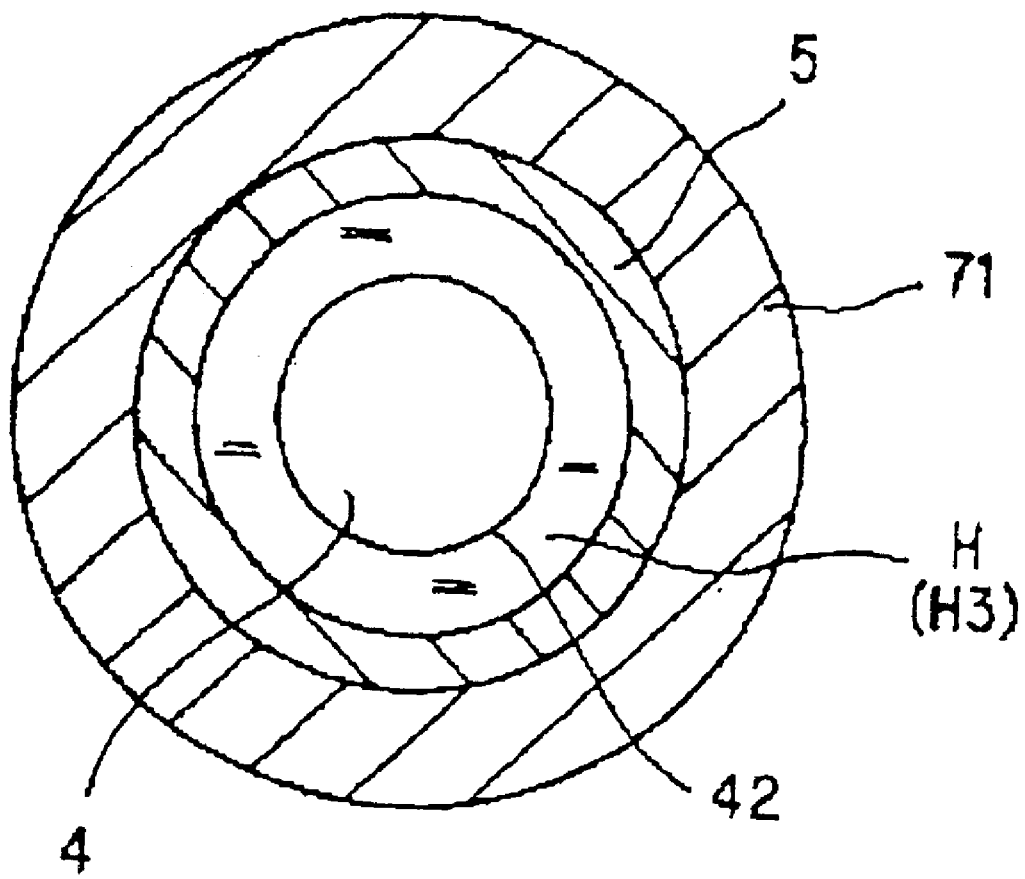
FIG. 5 is a front view of lamp unit and optical guide of FIG. 3 viewed from the apex of the lamp.

FIG. 5 is a front view of the lamp unit R and the optical guide 7 of FIG. 3 viewed from the apex of the lamp. The section of coupling member H opposing luminous unit 42 of lamp 4 forms a reflection surface H3. The reflectance on the surface of reflection surface H3 can be raised by application of a metal coating. As a result, light radiated from lamp 4 and light reflected from the inner surface of front optical guide 71 and then returned toward lamp 4 can be efficiently reflected in the direction of the aperture of front optical guide 71 to permit efficient wafer heating.

Figure 6:
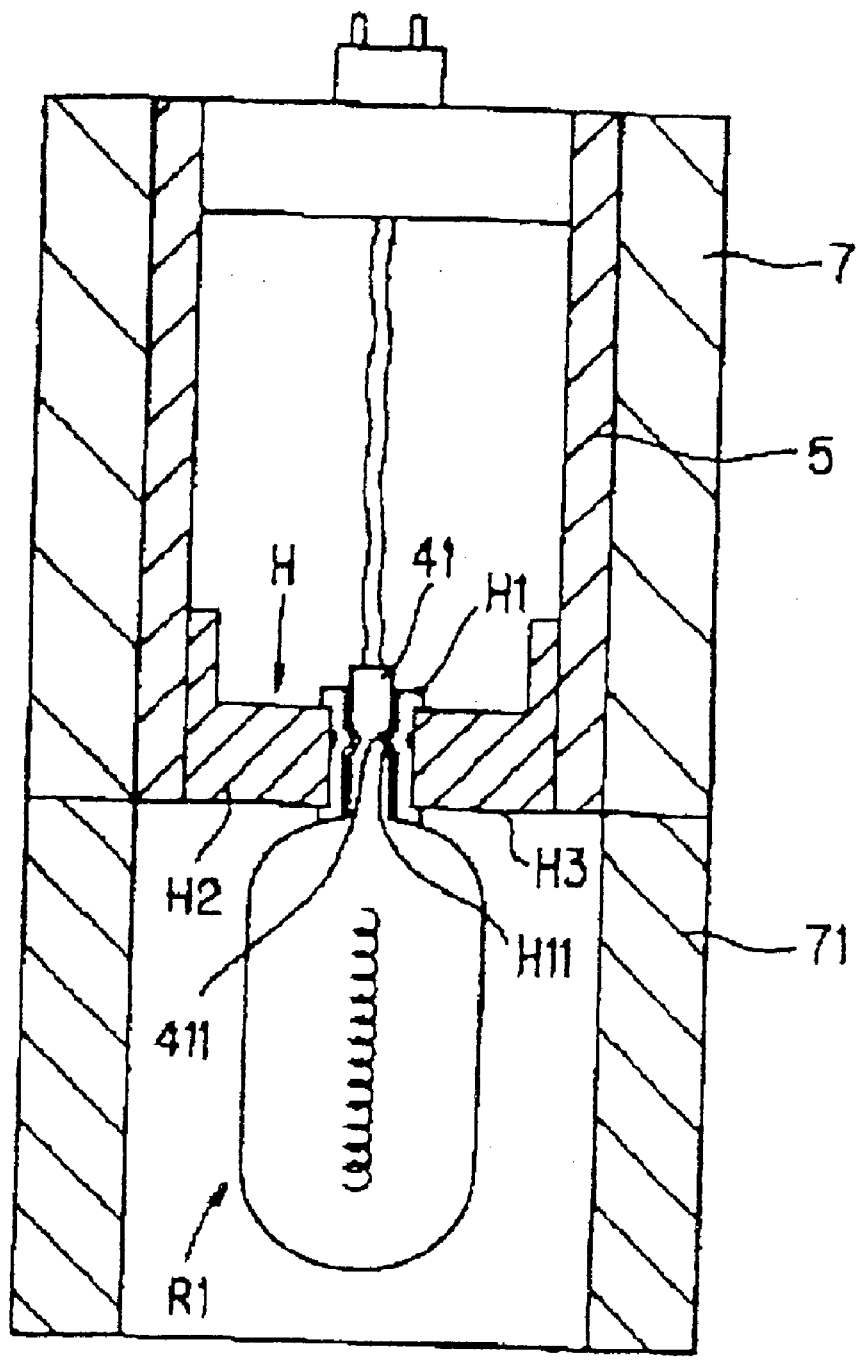
FIG. 6 is a side view of a second embodiment of the lamp unit.
Figure 7:
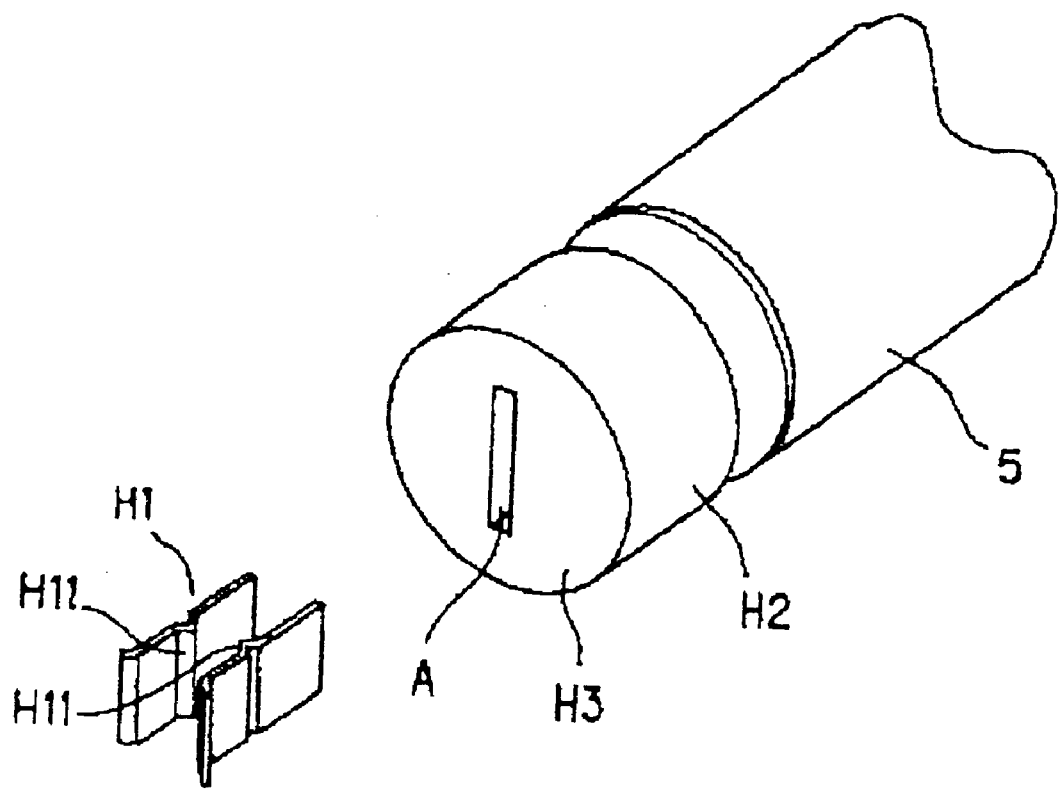
FIG. 7 is a perspective view of the contact support unit and the contact fastening unit of the lamp unit of FIG. 5.

FIG. 6 is an explanatory figure showing another embodiment of the lamp unit. Coupling member H in lamp unit R1 comprises contact fastening unit H2 made of a block of aluminum and flat contact support unit H1 of copper. When contact support unit H1 contacts sealed part 41, part of contact support unit H1 forms projection H11. This projection H11 mates with depression 411 of sealed part 41 to reliably support lamp 4. On the other hand, the external shape of contact fastening unit H2 is cylindrical, as shown in FIG. 7. The outer diameter is roughly equal to the inner diameter of sleeve 5. Contact fastening unit H2 is pushed and press fit to the forward aperture of sleeve 5 with the outer circumference of contact fastening unit H2 mated and fastened to the inner surface of sleeve 5.

Contact support unit H1 comprises a set of metal plates, one end of which is bent in advance, as shown in FIG. 7. Furthermore, aforementioned projection H11 is then formed with elasticity provided by this bending. Insertion aperture A of the lamp sealed unit of contact fastening unit H2 is fitted in this state. When one end of contact support unit H1 penetrates contact fastening unit H2, the other edge that penetrates and jumps out is bent as shown in FIG. 6. Sealed part 41 of lamp 4 is press fit in the gap formed with opposing contact support unit H1, and both sides of sealed part 41 are pinched and supported by contact fastening unit H2. The surface of contact support unit H1 of coupling member H that faces luminous unit 42 of lamp 4 then forms reflection surface H3.

Figure 8:
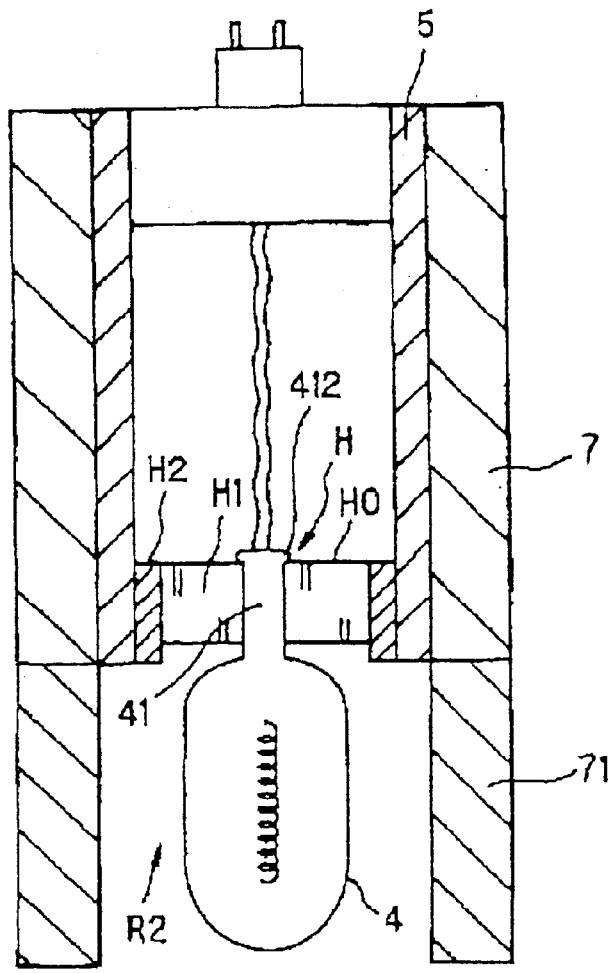
FIG. 8 is a side view of a third embodiment of the lamp unit.
Figure 9:
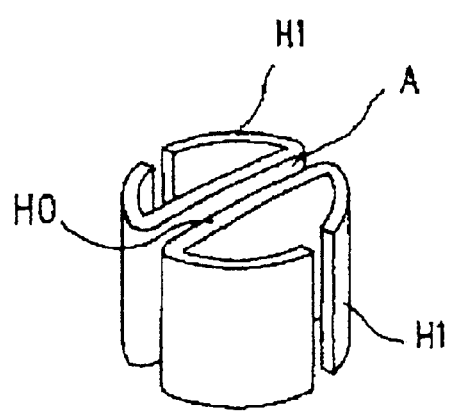
FIG. 9 is perspective view of the contact fastening unit of the lamp unit of FIG. 5.

FIG. 8 is illustrates an embodiment of the lamp unit whereby coupling member H in lamp unit R2 has contact support unit H1 and contact fastening unit H2 as separate units. Contact support unit H1 comprises a set of metal plates that are bent in prescribed shape, as shown in FIG. 9, to provide elasticity. This contacts both sides of sealed part 41 to pinch and support it. While lamp 4 is supported by contact support unit H1, it is fitted so as to contact the inner surface of contact fastening unit H2 that is a ring-shaped metal unit. At this time, contact support unit H1 is firmly fastened to contact fastening unit H2 by the outward expansive elastic force of contact support unit H1 and sealed part 41 is pinched and supported by contact support unit H1. Thick section 412 that is thicker than the surface of sealed part 41 is formed at the edge of sealed part 41 when sealed part 41 is molded. Thick section 412 engages ridge H0 of contact support unit H1 to prevent lamp 4 from being removed from contact support unit H1.

Figure 10:
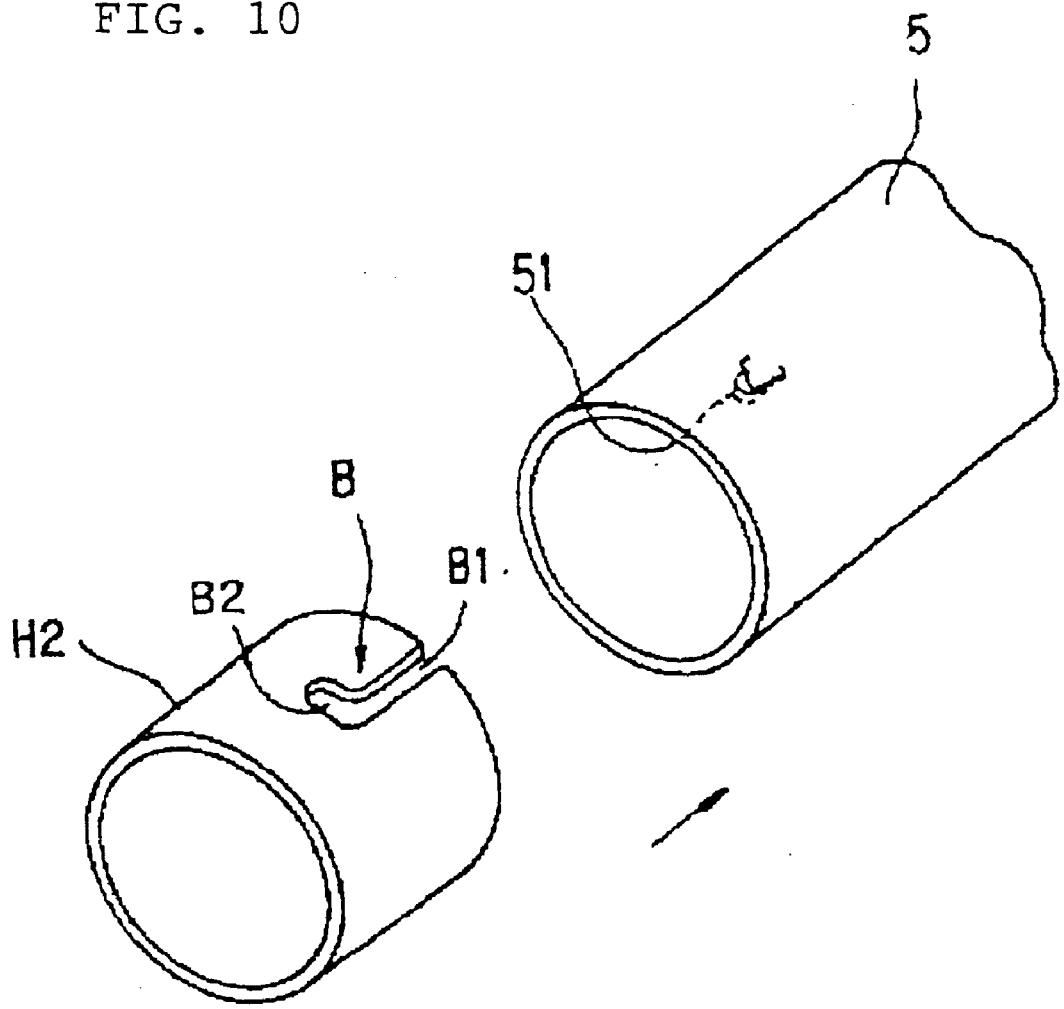
FIG. 10 is a perspective view of the contact fastening unit of the lamp unit of FIG. 8.

The outer diameter of contact fastening unit H2 which is roughly equal to the inner diameter of sleeve 5 has an L-shaped notch B formed in one end, as shown in FIG. 10. Contact fastening unit H2 is press fit within sleeve 5 while guide section B1 of notch B is situated within projection 51 that protrudes on the inner surface of compression molded sleeve 5 by punching the outer circumference of sleeve 5. Subsequently, the fastening part B2 of notch B mates with projection 51 by rotating contact fastening unit H2, as a result of which contact fastening unit H2 is reliably mated in contact with the inner surface of sleeve 5.

Figure 11:
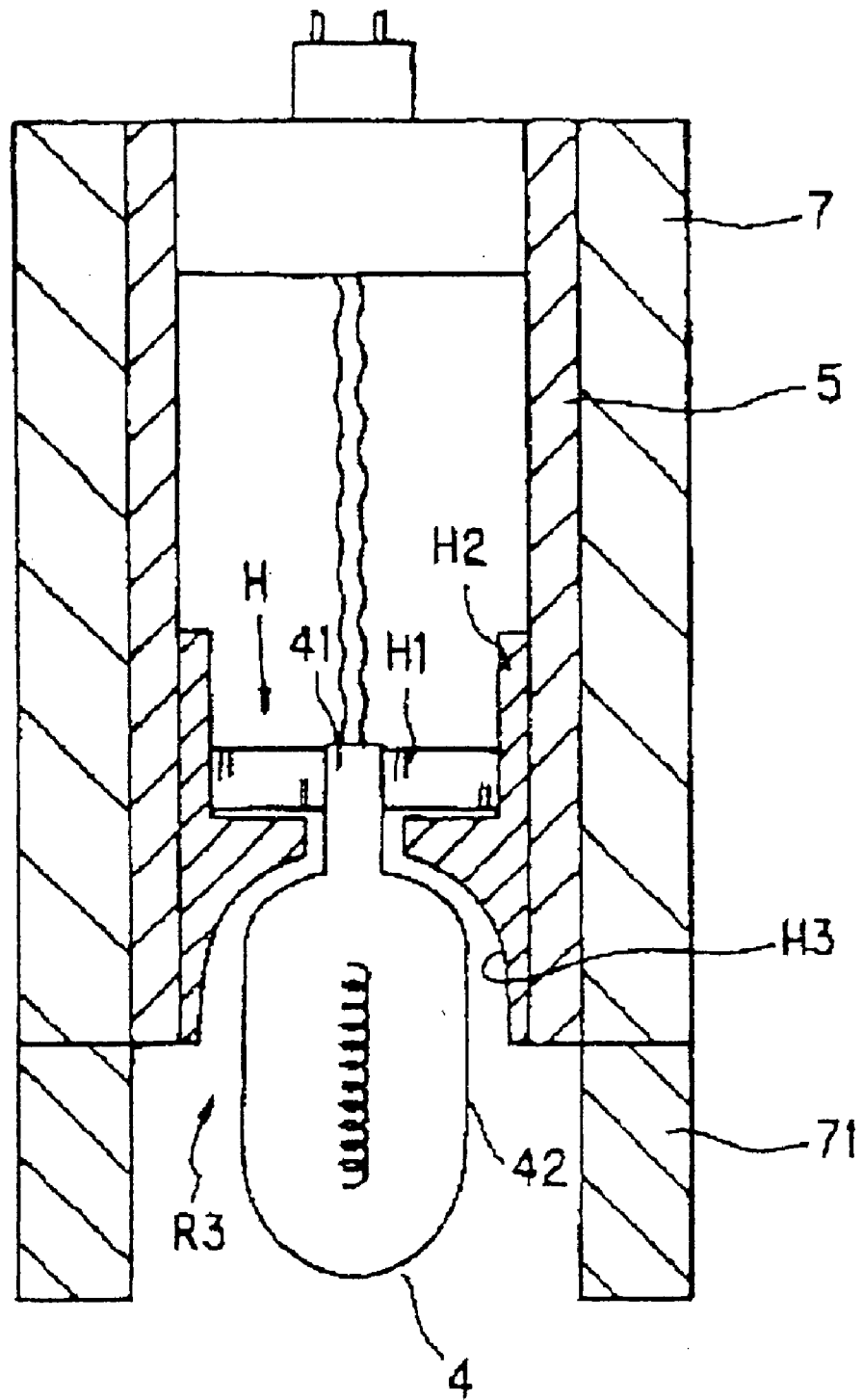
FIG. 11 is a side view of a fourth embodiment of the lamp unit.

FIG. 11 illustrates another embodiment of the lamp unit whereby coupling member H in lamp unit R3 comprises contact fastening unit H2 made of a block of aluminum and flat contact support unit H1 of copper. Contact support unit H1 comprises a set of metal plates that are bent in prescribed shape, just as shown in FIG. 9, to provide elasticity so that contact support unit H1 is firmly fastened to the inner circumferential surface of contact fastening unit H2 through the outward expansive elastic force of contact support unit H1, and sealed part 41 is pinched and supported by contact support unit H1. The external shape of contact fastening unit H2 is cylindrical, just as in embodiment 2. The outer diameter is roughly equal to the inner diameter of sleeve 5. Contact fastening unit H2 is pushed and press fit to the forward aperture of sleeve 5 with the outer circumference of contact fastening unit H2 mated while in contact with the inner surface of sleeve 5. The portion of coupling member H that faces luminous unit 42 of lamp 4 then forms reflection surface H3. In this manner, light reflected off reflection surface H3 can be reflected to the aperture side of optical guide 7 at high efficiency since reflection surface H3 is a surface curved in hyperbolic or radiant shape.

The lamp units in accordance to the invention can solve the various problems associated with adhesive of conventional lamp units just like the lamp unit of embodiment 1. Specifically, contamination of the interior of a processing chamber due to peeling of adhesive itself does not occur. The shorting of lead lines that supply power to lamp 4 due to the effects of moisture contained in adhesive does not take place. The decline in the reflectance due to contamination by moisture on the inner surface of optical guide 7 does not take place. Devitrification of the luminous tube due to moisture does not take place and the irradiation intensity is not attenuated since adhesive is not used.

Furthermore, sealed part 41 is connected to sleeve 5 by coupling member H. Since sleeve 5 is mated to optical guide 7 on its outer circumferential surface, heat from lamp 4 is transmitted to coupling member H via sealed part 41. The heat transmitted to coupling member H is then transmitted to sleeve 5. The heat transmitted to sleeve 5 is then transmitted to optical guide 7. The heat transmitted to optical guide 7 is then transferred to the cooling liquid circulating on the outer surface. Consequently, a series of heat-conduction passages are formed that reliably cool lamp 4.

Furthermore, light radiated from lamp 4 and light reflected off the inner surface of front optical guide 71 and then returned toward lamp 4 can be efficiently reflected in the direction of the aperture of front optical guide 71 to permit efficient wafer heating since the section of coupling member H opposing luminous unit 42 of lamp 4 forms reflection surface H3.

while the present invention has been described in connection with what is considered to be the most practical embodiments, it is understood that this invention is not limited to the disclosed embodiments and may reasonable encompass various arrangements included with in the spirit and scope of the broadest interpretations and equivalent arrangements.

I claim:

1. A lamp unit mounted within an optical guide arranged in a photoirradiating heating device that rapidly heats a semiconductor wafer by infrared rays emitted from a single ended lamp, said lamp unit comprising:
    a sleeve for fastening the lamp unit within the optical guide;
    a lamp attached to an inner surface of said sleeve, said lamp including a seal member; and
    a coupling device for attaching said lamp to said sleeve;
    wherein said coupling device includes a heat-transfer support member that supports said seal member of said lamp through elastic force and a fastening member connected to said heat-transfer support member that makes contact with an inner surface of said sleeve.

2. The lamp unit of claim 1, wherein said heat-transfer support includes a metal plate bent in a predetermined shape to transfer heat from said lamp to said sleeve.

3. The lamp unit of claim 1, wherein said fastening member includes a metal block.

4. The lamp unit of claim 1, wherein at least a part of said coupling device includes a reflecting surface.

5. The lamp unit of claim 1, wherein said coupling device is composed at least partially of a metal.

6. The lamp unit of claim 1, wherein said coupling device is composed of a pre-molded plastic.

7. The lamp unit of claim 1, wherein said coupling device is composed of a ceramic material.

* * * * *